United States Patent
Xu et al.

(10) Patent No.: US 9,837,983 B2
(45) Date of Patent: Dec. 5, 2017

(54) ACOUSTIC FILTER DEVICE WITH COMBINED PASSBAND

(71) Applicant: Avago Technologies General IP (Singapore) Pte. Ltd., Singapore (SG)

(72) Inventors: Hongya Xu, Munich (DE); Paul Bradley, Los Altos, CA (US); Andriy Yatsenko, Munich (DE); Lueder Elbrecht, Munich (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 149 days.

(21) Appl. No.: 14/657,828

(22) Filed: Mar. 13, 2015

(65) Prior Publication Data

US 2016/0268998 A1     Sep. 15, 2016

(51) Int. Cl.
    *H03H 9/54*     (2006.01)
    *H03H 9/64*     (2006.01)
    *H03H 9/00*     (2006.01)
    *H03H 9/56*     (2006.01)
    *H03H 9/60*     (2006.01)

(52) U.S. Cl.
    CPC ............ *H03H 9/54* (2013.01); *H03H 9/0004* (2013.01); *H03H 9/568* (2013.01); *H03H 9/605* (2013.01); *H03H 9/6423* (2013.01); *H03H 9/6483* (2013.01); *H03H 2240/00* (2013.01); *H03H 2250/00* (2013.01)

(58) Field of Classification Search
    CPC .. H03H 9/24; H03H 9/46; H03H 9/54; H03H 9/566; H03H 9/568; H03H 9/60; H03H 9/605; H03H 9/64; H03H 9/6426; H03H 9/644; H03H 9/6476; H03H 9/6483; H03H 9/70; H03H 9/703; H03H 9/72; H03H 9/52; H03H 9/6406; H03H 9/6423; H03H 2240/00; H03H 2250/00
    USPC ........................................... 333/189–195, 133
    See application file for complete search history.

(56) References Cited

U.S. PATENT DOCUMENTS

| 3,697,788 | A | * | 10/1972 | Parker | H03H 9/56 257/416 |
| 4,390,854 | A | * | 6/1983 | Colvin | H03H 9/6426 333/193 |
| 5,136,266 | A | * | 8/1992 | Niitsuma | H03H 9/44 310/313 B |

(Continued)

FOREIGN PATENT DOCUMENTS

| JP | 8-316784 A | * | 11/1996 |
| JP | 2004-128738 A | * | 4/2004 |
| JP | 2013-197772 A | * | 9/2013 |

OTHER PUBLICATIONS

English language machine translation of JP 2004-128738, published Apr. 22, 2004, 8 pages.*

(Continued)

*Primary Examiner* — Barbara Summons

(57) ABSTRACT

An acoustic filter device for telecommunication devices includes a first acoustic band pass filter having a corresponding first passband and a second acoustic band pass filter having a corresponding second passband. The second acoustic band pass filter is connected in parallel with the first acoustic band pass filter to provide a combined passband including the first and second passbands.

14 Claims, 8 Drawing Sheets

(56) References Cited

U.S. PATENT DOCUMENTS

| | | | | |
|---|---|---|---|---|
| 5,194,836 A | * | 3/1993 | Vale | H03H 9/542 |
| | | | | 310/320 |
| 5,428,814 A | * | 6/1995 | Mort | H04B 7/2046 |
| | | | | 333/101 |
| 5,592,040 A | * | 1/1997 | Yamamoto | H03H 9/6433 |
| | | | | 310/313 D |
| 5,666,092 A | | 9/1997 | Yamamoto et al. | |
| 6,115,592 A | * | 9/2000 | Ueda | H03H 9/0576 |
| | | | | 455/303 |
| 6,606,016 B2 | * | 8/2003 | Takamine | H03H 9/0028 |
| | | | | 333/133 |
| 6,724,278 B1 | * | 4/2004 | Smith | H04B 1/005 |
| | | | | 333/101 |
| 7,102,269 B2 | * | 9/2006 | Watanabe | H03H 9/14514 |
| | | | | 310/313 D |
| 7,242,268 B2 | * | 7/2007 | Hagiwara | H01P 1/15 |
| | | | | 333/103 |
| 8,742,870 B2 | | 6/2014 | Franzon et al. | |
| 2010/0188165 A1 | * | 7/2010 | Nakamura | H04B 1/0057 |
| | | | | 333/124 |
| 2012/0001727 A1 | * | 1/2012 | Telgmann | H03H 9/6433 |
| | | | | 340/5.64 |

OTHER PUBLICATIONS

English language machine translation of JP 2013-197772, published Sep. 30, 2013, 6 pages.*

English language machine translation of JP 8-316784, published Nov. 29, 1996, 3 pages.*

Johanna Meltaus et al., "SAW Filters Based on Parallel-Connected Coupled Resonator Filters with Offset Frequencies", IEEE Transactions on Ultrasonics, Ferroelectrics, and Frequency Control, vol. 54, No. 1, Jan. 2007, pp. 167-176.

* cited by examiner

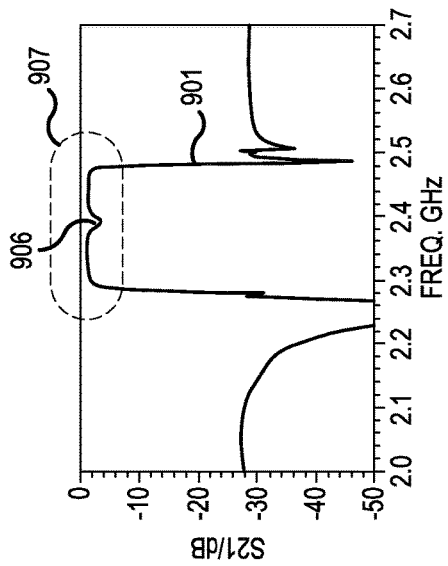
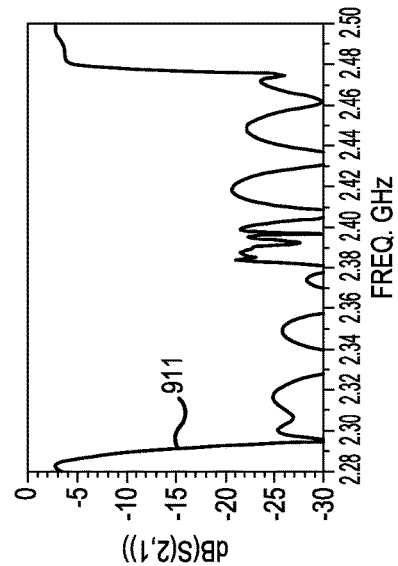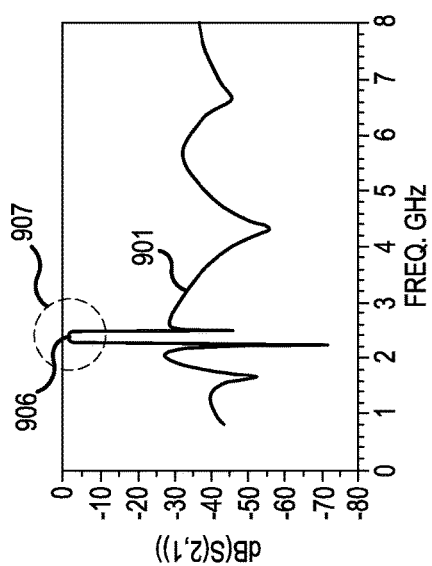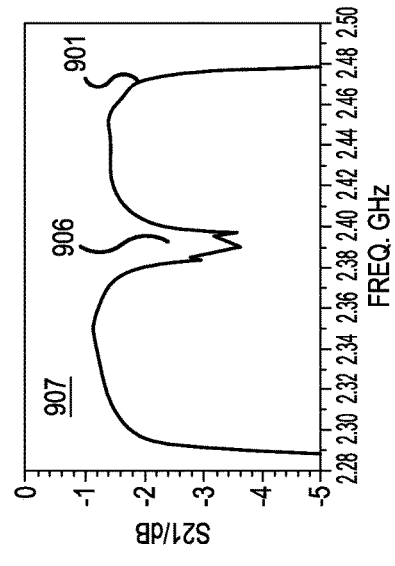
FIG. 9A
FIG. 9B
FIG. 9C
FIG. 9D

ACOUSTIC FILTER DEVICE WITH COMBINED PASSBAND

BACKGROUND

Portable communication devices, such as cellular telephones, portable computers, personal digital assistants (PDAs), Global Navigation Satellite System (GNSS) receivers (e.g., including global positioning system (GPS), GLONASS, and BeiDou), and the like, are configured to communicate over wireless networks. Such portable communication devices may enable communication over multiple networks, and therefore include transmitters, receivers, transceivers and/or corresponding filters for connecting to common antennas, and for sending and receiving signals (e.g., radio frequency (RF) signals) over the various networks.

Acoustic filters, in particular, used in portable communication devices provide distinct advantages in reducing cost and size require, while generally improving performance Acoustic filters include acoustic resonators, such as bulk acoustic wave (BAW) resonators or surface acoustic wave (SAW) resonators. The BAW resonators may include thin film bulk acoustic resonators (FBARs) and/or solidly mounted resonators (SMRs), for example. However, BAW and SAW resonators may not provide sufficient bandwidth from intrinsic acoustic coupling for wide band application. Other types of filters, such as LC based filters, may not provide sufficiently steep roll-off. Accordingly, there is a need for band pass filters for wireless communications with very high bandwidths and, at the same time, very steep roll-off, while maintaining or improving filtering quality.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIGS. 9A to 9D are a series of graphs showing simulated frequency response of an acoustic filter device including a combined passband, according to a representative embodiment.

DETAILED DESCRIPTION

Figure 1A:
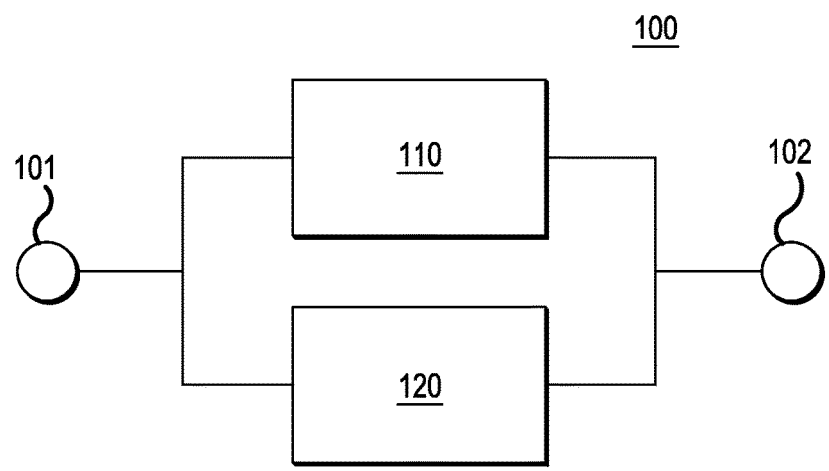
FIG. 1A is a simplified block diagram of an acoustic filter device for telecommunications having a combined passband, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element. Also, as used herein, "exemplary" refers to an example or an illustration.

Generally, according to various embodiments, an acoustic filter device provides a combined passband that includes multiple narrower passbands separated by gaps in the combined passband. For example, an acoustic filter device may include a first acoustic band pass filter having a corresponding first passband and a corresponding first roll-off, a second acoustic band pass filter having a corresponding second passband and a corresponding second roll-off. The first and second acoustic band pass filters are connected in parallel with one another filter to provide a combined passband including the first and second passbands. A band-gap is positioned between the first passband and the second passband, where the band-gap results in a dip in signal magnitude formed by non-overlapping portions of a first roll-off of the first acoustic band pass filter and a second roll-off of the second acoustic band pass filter, the second roll-off being adjacent to the first roll-off Each of the first and second acoustic band pass filters may have a ladder-type architecture (ladder-type acoustic filter) including multiple series and shunt acoustic resonators.

By including the parallel acoustic filter topology, the band pass filters are realized with very high bandwidth and steep roll-off by joining the corresponding passbands within the combined passband. For example, the very high bandwidth may be greater than about eight percent of center frequency $f_{center}$, and the steep roll-off may be less than about two percent of center frequency $f_{center}$, where the center frequency $f_{center}$ is a measure of the central frequency between the upper and lower cutoff frequencies of the filter or band.

Figure 1B:
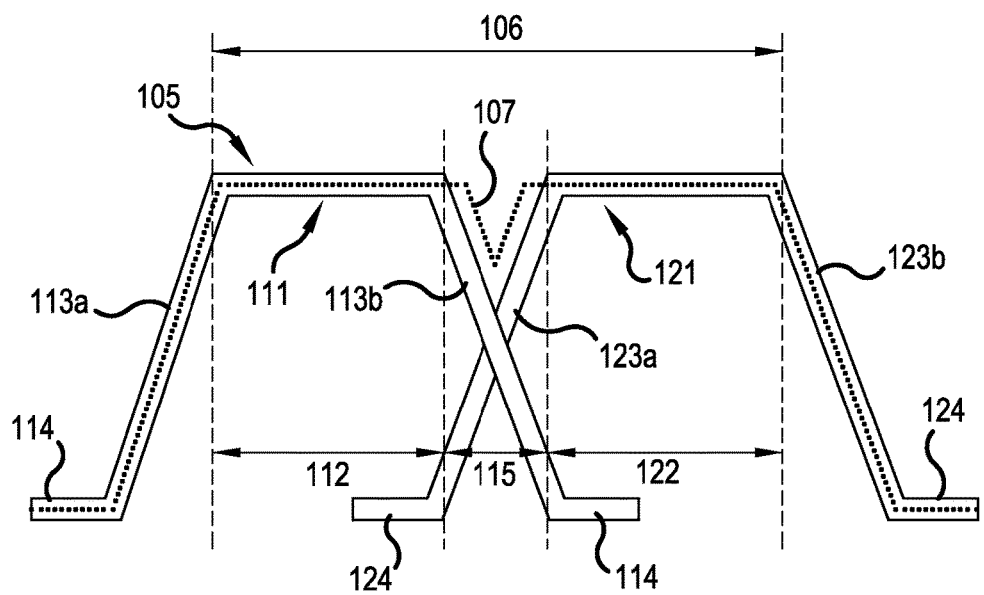
FIG. 1B is a graph showing a simplified frequency response of the acoustic filter device of FIG. 1A including a combined passband, according to a representative embodiment.

FIG. 1A is a simplified block diagram of acoustic filter device for telecommunication devices including a combined passband, according to a representative embodiment. FIG. 1B is a graph showing a simplified frequency response of the acoustic filter device of FIG. 1A including the combined passband, according to a representative embodiment.

Referring to FIG. 1A, acoustic filter device 100 includes a first band pass filter 110 and a second band pass filter 120, which may be receive or transmit filters, connected in parallel with the first band pass filter 110, between a first common port 101 and a second common port 102. The first and second band pass filters 110 and 120 have different passbands at corresponding operating frequencies, as discussed below. Accordingly, the first and second band pass filters 110 and 120 block (filter out) frequencies outside the respective passbands. In various embodiments, the first and second band pass filters 110 and 120 are acoustic band pass filters comprising acoustic resonators, such as bulk acoustic wave (BAW) resonators or surface acoustic wave (SAW) resonators. The BAW resonators may include thin film bulk acoustic resonators (FBARs) and/or solidly mounted resonators (SMRs), for example. Also, each of the first and second band pass filters 110 and 120 may have as ladder-type architecture, for example, including series and shunt connected acoustic resonators, discussed below with reference to FIG. 4.

One of the first and second common ports 101 and 102 may be an antenna port, for example, connected to an antenna (not shown) for receiving and/or transmitting wireless signals, such as radio frequency (RF) signals, corresponding to various networks and/or types of networks. The other one of the first and second common ports 101 and 102 may be a network port, for example, connected to a receiver, a transmitter or a transceiver (not shown) for receiving and/or transmitting signals, for example. The number of parallel connected band pass filters and corresponding networks and/or types of networks may be more than two (e.g., up to n band bass filters connected in parallel, where n is a positive integer greater than two), without departing from the scope of the present teachings, examples of which are discussed below with reference to FIGS. 5 and 7.

Referring to FIG. 1B, the first band pass filter 110 has a first frequency response 111 comprising a first passband 112 and corresponding lower and upper first roll-offs 113a and 113b. The lower and upper first roll-offs 113a and 113b provide the transitions between the first passband 112 and a first stopband 114. Likewise, the second acoustic band pass filter 120 has a second frequency response 121 comprising a second passband 122 and corresponding lower and upper second roll-offs 123a and 123b, which provide the transitions between the second passband 122 and a second stopband 124. A band-gap 115 exists between the first passband 112 and the second passband 122. That is, the frequency range of the band-gap 115 extends from a highest frequency of the first passband 112 to a lowest frequency of the second passband 122 (in the case where the first passband 112 includes lower frequencies than the second passband 122, as shown in the example of FIG. 1B). The first and second passbands 112 and 122 may correspond to predetermined frequency bands standard for telecommunication devices, respectively.

A combination of the first frequency response 111 and the second frequency response 121 (with the band-gap 115 in between) forms combined frequency response 105, indicated by a dotted line in FIG. 1B. The combined frequency response 105 provides a combined passband 106, which includes a combination of the first passband 112 and the second passband 122 (with the band-gap 115 in between). A dip 107, which is a localized reduction in signal amplitude, is formed in the combined frequency response 105 substantially in the vicinity of the band-gap 115. More particularly, a portion of the upper first roll-off 113b overlaps with a portion of the lower second roll-off 123a at least in part within the band-gap 115. Non-overlapping portions of the upper first roll-off 113b and the lower second roll-off 123a form the dip 107. Generally, the frequency range of the dip 107 may substantially correspond to the frequency range of the band-gap 115. In other words, the frequency range of the dip 107 may likewise extend substantially from the highest frequency of the first passband 112 to the lowest frequency of the second passband 122. In an embodiment, the lowest magnitude of signal in the dip 107 is between about 3 dB and about 6 dB below the highest magnitude of signal in the combined passband 106, for example, although the reduction in signal magnitude within the dip 107 may vary without departing from the scope of the present teachings.

Figure 2:
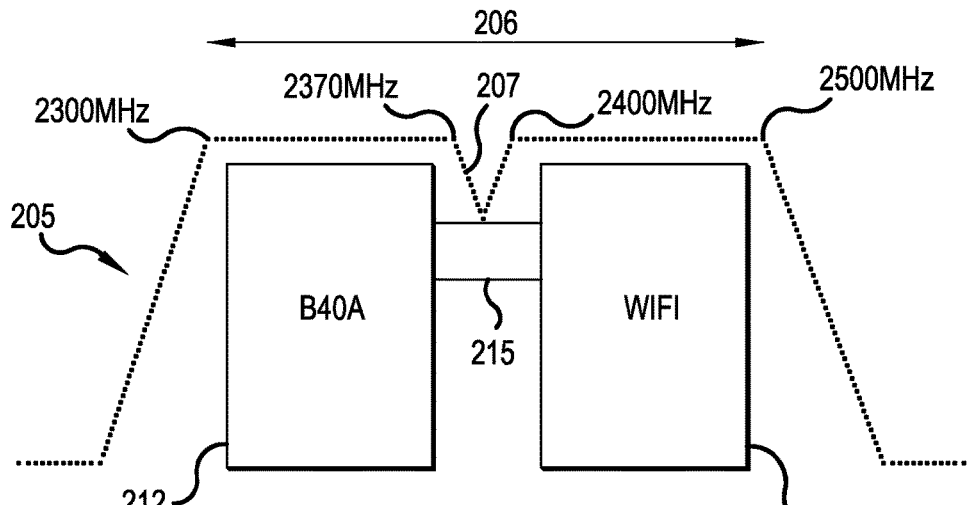
FIG. 2 is a graph simplified frequency response of an acoustic filter device having a combined passband that includes two exemplary predetermined frequency bands and a single dip in signal magnitude, according to a representative embodiment.

FIG. 2 is a graph simplified frequency response of an acoustic filter device having a combined passband that includes two exemplary frequency bands and a dip in signal magnitude, according to a representative embodiment. In the depicted example, each of the two frequency bands corresponds to a single predetermined frequency band.

Referring to FIGS. 1A and 2, the first band pass filter 110 has a first passband 212 corresponding to Long Term Evolution (LTE) (alternatively 3rd Generation Partnership Project (3GPP)) band 40A, extending from 2300 MHz to 2370 MHz. The second band pass filter 120 has a second passband 222 corresponding to WiFi (IEEE 802.11), extending from 2400 MHz to 2500 MHz. The present example therefore results in a band-gap 215 of about 30 MHz between the first passband 212 and the second passband 222, and a combined passband 206 of about 200 MHz. The dip 207 in the combined passband 206 is shifted into the band-gap 215.

Figure 3:
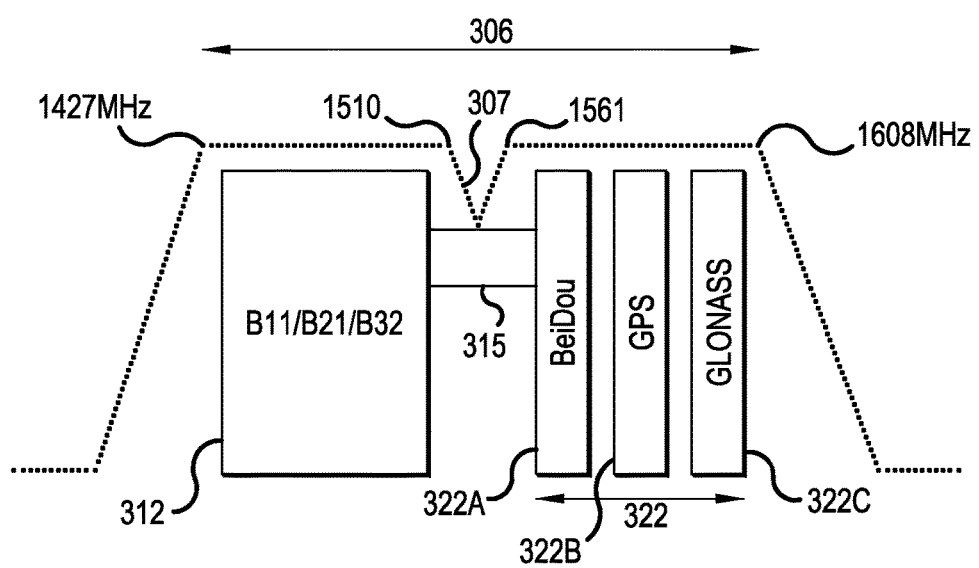
FIG. 3 is a graph simplified frequency response of an acoustic filter device having a combined passband that includes more than two exemplary frequency bands and a single dip in signal magnitude, according to a representative embodiment.

FIG. 3 is a graph simplified frequency response of an acoustic filter device having a combined passband that includes more than two exemplary frequency bands and a dip in signal magnitude, according to a representative embodiment. In the depicted example, there are four passbands, each corresponding to a combination of predetermined frequency bands or single frequencies. One passband includes multiple (three) bands is formed on the low frequency side of the dip, while multiple passbands corresponding to multiple (three) bands are formed on the high frequency side of the dip. Of course, other combinations of size and numbers of passbands formed on the low and high frequency sides of the dip, respectively, may be implemented without departing from the scope of the present teachings.

In particular, referring to FIGS. 1A and 3, the first band pass filter 110 has a first passband 312, which combines uplinks/downlinks of LTE band 11 (1427.9 MHz to 1447.9 MHz/1475.9 MHz to 1495.9 MHz), LTE band 21 (1447.9 MHz to 1462.9 MHz/1495.9 MHz to 1510.9 MHz) and downlink of LTE band 32 (1452 MHz to 1496 MHz), such that the total band width of the first passband 312 extends from about 1427 MHz to about 1510 MHz. The various frequency bands are combined into the single first passband 312 due to the overlapping corresponding frequency ranges. The second band pass filter 120 has three second passbands 322A, 322B and 322C, which correspond to downlink satellite communication frequencies for BeiDou (1561 MHz), GPS (1575 MHz) and GLONASS (1602 MHz). This results in a composite second passband 322 from about 1561 MHz to about 1609 MHz. The present example results in a band-gap 315 of about 51 MHz between the first passband 312 and the composite second passband 322, and a combined passband 306 of about 181 MHz.

Notably, because the first band pass filter 110 and the second band pass filter 120 operate at similar frequency ranges, the first pass filter 110 and the second band pass filter 120 may be integrated into one physical layout. This approach provides improved performance and smaller laminate packages, while the number of acoustic resonators (e.g., FBAR) dies can be kept at a minimum. Integrating band pass filters, when possible, generally is desirable for any of the various embodiments discussed herein.

The dip 307 in the combined passband 306 is shifted into the band-gap 315. Notably, though, there are no dips between adjacent second passbands 322A, 322B and 322C. This is due to the relatively close proximity of values of the adjacent frequencies, such that corresponding band-gaps would be too small to accommodate an appreciable dip in the combined passband 306. Therefore, without intervening dips, the second passbands 322A, 322B and 322C are effectively treated as a single second passband (e.g., composite second passband 322).

Figure 4:
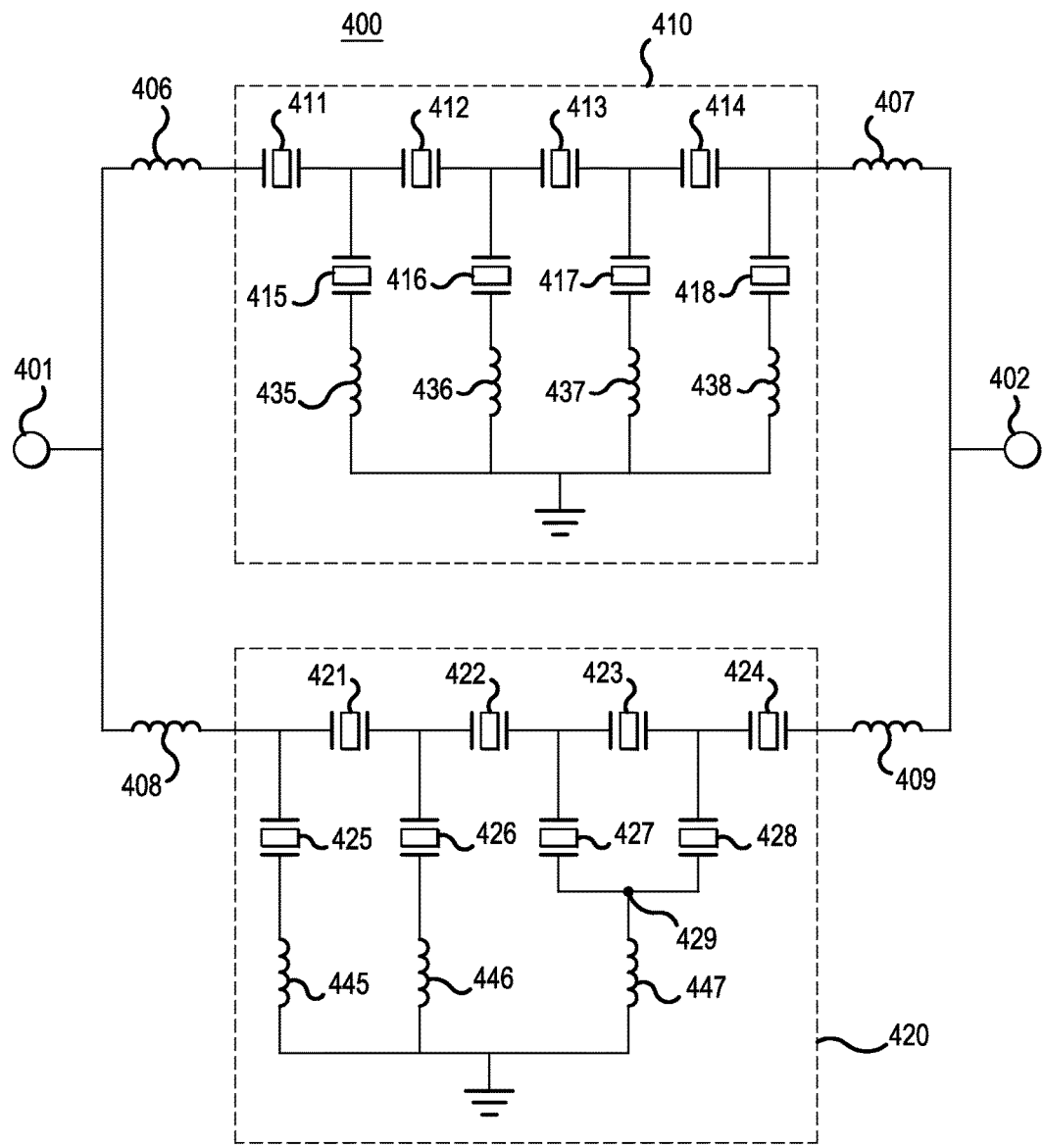
FIG. 4 is a simplified circuit diagram of an acoustic filter device, such as the acoustic filter device depicted in FIG. 1, including a combined passband, according to a representative embodiment.

FIG. 4 is a simplified circuit diagram of an acoustic filter device, such as the acoustic filter device depicted in FIG. 1, including a combined passband, according to a representative embodiment.

Referring to FIG. 4, an acoustic filter device 400 includes two parallel connected band pass filters, first band pass filter 410 and second band pass filter 420, for purposes of illustration, although embodiments are not limited thereto. The first band pass filter 410 and a second band pass filter 420 are connected in parallel between a first common port 401 and a second common port 402. The first and second band pass filters 410 and 420 have different passbands at corresponding operating frequencies. More particularly, in the present example, the first band pass filter 410 has a first passband corresponding to LTE band 40A, extending from 2300 MHz to 2370 MHz, and the second band pass filter 420 has a second passband corresponding to WiFi, extending from 2400 MHz to 2500 MHz, operation of which would result in substantially the same frequency response of a combined passband (e.g., combined passband 206) as shown in FIG. 2, discussed above.

In the depicted representative embodiment, the first band pass filter 410 is a ladder-type acoustic filter comprising series and shunt connected acoustic resonators, such as BAW or SAW resonators. More particularly, the first band pass filter 410 includes series acoustic resonators 411, 412, 413 and 414 and shunt acoustic resonators 415, 416, 417 and 418. The shunt acoustic resonator 415 is connected between the series acoustic resonators 411 and 412. The shunt acoustic resonator 416 is connected between the series acoustic resonators 412 and 413. The shunt acoustic resonator 417 is connected between the series acoustic resonators 413 and 414. The shunt acoustic resonator 418 is connected between the series acoustic resonator 414 and the second common port 402. The shunt acoustic resonators 415, 416, 417 and 418 are also connected to ground via shunt inductors 435, 436, 437 and 438, respectively. A series inductance 406 is connected between the series acoustic resonator 411 and the first common port 401, and a series inductance 407 is connected between the series acoustic resonator 414 and the second common port 402.

The second band pass filter 420 includes series acoustic resonators 421, 422, 423 and 424 and shunt acoustic resonators 425, 426, 427 and 428. The shunt acoustic resonator 425 is connected between first common port 401 and the series acoustic resonator 421. The shunt acoustic resonator 426 is connected between the series acoustic resonators 421 and 422. The shunt acoustic resonator 427 is connected between the series acoustic resonators 422 and 423. The shunt acoustic resonator 428 is connected between the series acoustic resonators 423 and 424. The shunt acoustic resonators 425 and 426 are also connected to ground via shunt inductors 445 and 446, respectively, while the shunt acoustic resonators 427 and 428 are connected together at node 429, which is connected to ground via shunt inductor 447. A series inductance 408 is connected between the series acoustic resonator 421 and the first common port 401, and a series inductance 409 is connected between the series acoustic resonator 424 and the second common port 402.

Although the shunt inductors 435-438 of the first band pass filter 410, the shunt inductors 445-447 of the second band pass filter 420, and the series inductances 406-409 of the acoustic filter device 400 are depicted as actual inductor components, it is understood that one or more of these shunt and series inductors may be implemented, in whole or in part, as line inductances. Of course, various arrangements of acoustic resonators, inductors and/or other circuit components may vary, to provide unique benefits for particular situations or to meet application specific design requirements of various implementations of the acoustic filter device 400, as would be apparent to one skilled in the art.

Also, for purposes of illustration, the first network to which the first band pass filter 410 is connected is an LTE band 40A network, and the second network to which the second band pass filter 420 is connected is a WiFi network, as mentioned above. However, other types of networks may be incorporated without departing from the scope of the present teachings. One or both of the first and second common ports 401 and 402 may be connected to a switch, a coupler or a multiplexer configured to transfer RF signals between a transmitter, receiver or transceiver (not shown) and an antenna (not shown), for example.

Figure 5:
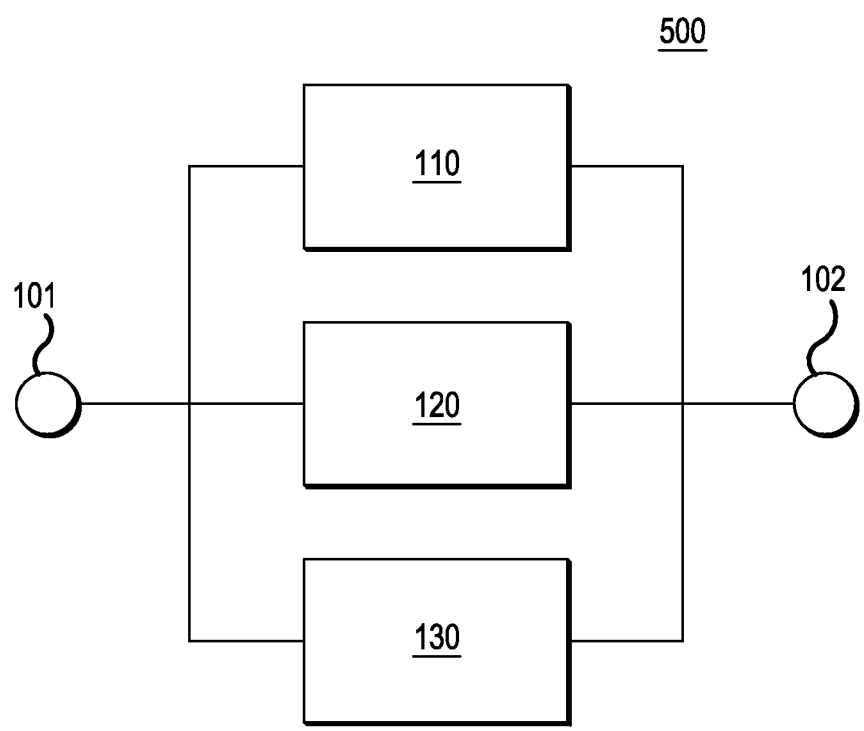
FIG. 5 is a simplified block diagram of an acoustic filter device for telecommunications having a combined passband, according to another representative embodiment.
Figure 6A:
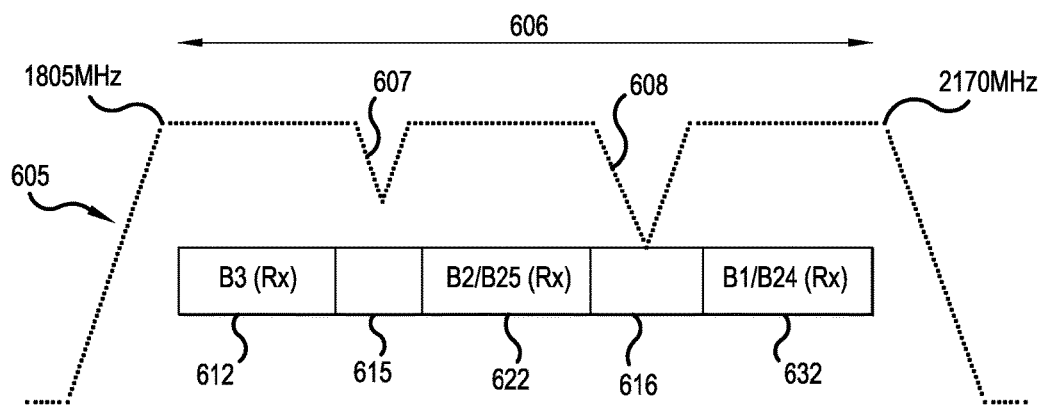
FIG. 6A is a graph showing a simplified frequency response of the acoustic filter device of FIG. 5 including a combined passband with multiple dips, according to a representative embodiment.
Figure 6B:
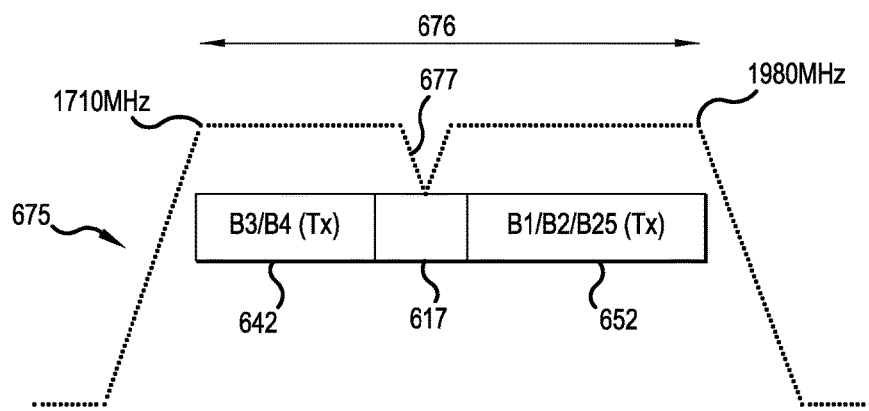
FIG. 6B is a graph showing a simplified frequency response of the acoustic filter device of FIG. 5 including a combined passband with a single dip, according to another representative embodiment.

FIG. 5 is a simplified block diagram of an acoustic filter device for a telecommunication device having a combined passband, according to another representative embodiment. FIG. 6A is a graph showing a simplified downlink frequency response of the acoustic filter device of FIG. 5 including a combined passband with multiple dips, and FIG. 6B is a graph showing a simplified uplink frequency response of the acoustic filter device of FIG. 5 including a combined passband with a single dip, according to representative embodiments.

Referring to FIG. 5, acoustic filter device 500 includes a first band pass filter 110, a second band pass filter 120 and a third band pass filter 130, all connected in parallel with one another between first common port 101 and second common port 102. The first, second and third band pass filters 110, 120 and 130 have different passbands at corresponding operating frequencies, as discussed below. Accordingly, the first, second and third band pass filters 110, 120 and 130 block (filter out) frequencies outside the respective passbands. In various embodiments, the first, second and third band pass filters 110, 120 and 130 are acoustic band pass filters comprising acoustic resonators, such as BAW resonators (e.g., FBARs and/or SMRs) or SAW resonators, for example. Also, each of the first, second and third band pass filters 110, 120 and 130 may have a ladder-type architecture, for example, including series and shunt connected acoustic resonators, similar to the discussion above with reference to FIG. 4.

Referring to FIG. 6A, a downlink combined frequency response 605 (indicated by a dotted line) is shown. The combined frequency response 605 is formed by effectively combining a first frequency response corresponding to the first band pass filter 110 (e.g., first frequency response 111 in FIG. 1A), a second frequency response corresponding to the second band pass filter 120 (e.g., second frequency response 121 in FIG. 1A) and a third frequency response corresponding to the third band pass filter 130. The first, second and third frequency responses may be substantially the same in shape as the individual frequency responses shown in FIG. 1A, for example (with corresponding passbands, roll-offs and stopbands), but are not specifically depicted in FIG. 6A for the sake of convenience.

The first frequency response corresponds to first passband 612, the second frequency response corresponds to second passband 622 and the third frequency response corresponds to third passband 632. A first band-gap 615 exists between the first passband 612 and the second passband 622, and a second band-gap 616 exists between the second passband 622 and the third passband 632. That is, the frequency range of the first band-gap 615 extends from a highest frequency of the first passband 612 to a lowest frequency of the second passband 622 (in the case where the first passband 612 includes lower frequencies than the second passband 622, as shown in the example of FIG. 6A). Likewise, the frequency range of the second band-gap 616 extends from a highest frequency of the second passband 622 to a lowest frequency of the third passband 632 (in the case where the second passband 622 includes lower frequencies than the third passband 632). A first dip 607 is formed in the combined frequency response 605 substantially in the vicinity of the first band-gap 615, and a second dip 608 is formed in the combined frequency response 605 substantially in the vicinity of the second band-gap 616.

More particularly, a portion of an upper first roll-off of the first frequency response overlaps with a portion of a lower second roll-off of the second frequency response at least in part within the first band-gap 615, while the non-overlapping portions form the first dip 607. Likewise, a portion of an upper second roll-off of the second frequency response overlaps with a portion of a lower third roll-off of the third frequency response at least in part within the second band-gap 616, while the non-overlapping portions form the second dip 608. Generally, the frequency range of the first dip 607 may substantially correspond to the frequency range of the first band-gap 615, and the frequency range of the second dip 608 may substantially correspond to the frequency range of the second band-gap 616. Notably, a lower roll-off of the combined frequency response 605 substantially coincides with a lower first roll-off of the first frequency response, and an upper roll-off of the combined frequency response 605 substantially coincides with an upper third roll-off of the third frequency response.

In the depicted example, the lowest magnitude of signal in the first dip 607 is less than the lowest magnitude of signal in the second dip 608. That is, the lowest magnitude of signal in the first dip 607 may be between about 3 dB and about 6 dB below the highest magnitude of signal in the combined passband 606, while the lowest magnitude of signal in the second dip 608 may be between about 3 dB and about 10 dB below the highest magnitude of signal in the combined passband 606. The first dip 607 is smaller than the second dip 608 generally because the first band-gap 615 has a smaller frequency range than the second band-gap 616, as discussed below. Stated differently, the first and second passbands 612 and 622 are closer to one another than the second and third passbands 622 and 632 resulting in the first dip 607 being smaller than the second dip 608. Of course, the reduction in signal magnitude within each of the first dip 607 and the second dip 608 may vary without departing from the scope of the present teachings.

In the depicted embodiment, there are three passbands within the combined passband 606, each corresponding to a combination of predetermined frequency bands or a single frequency band. In particular, referring to FIGS. 5 and 6A, the first band pass filter 110 has the first passband 612, which corresponds to the downlink of LTE band 3 (1805 MHz to 1880 MHz). Since there is only one frequency band, the total band width of the first passband 612 is substantially the same, extending from about 1805 MHz to about 1880 MHz. The second band pass filter 120 has the second passband 622, which combines the downlinks of LTE band 2 (1930 MHz to 1990 MHz) and LTE band 25 (1930 MHz to 1995 MHz), such that the total band width of the second passband 622 extends from about 1930 MHz to about 1995 MHz. The third band pass filter 130 has the third passband 632, which combines the downlinks of LTE band 1 (2110 MHz to 2170 MHz) and LTE band 4 (2110 MHz to 2125 MHz), such that the total band width of the third passband 632 extends from about 2110 MHz to about 2170 MHz. The various frequency bands are combined into the second and third passbands 622 and 632, respectively, due to the overlapping corresponding frequency ranges.

The present example results in the first band-gap 615 between the first passband 612 and the second passband 622 being about 50 MHz, and the second band-gap 616 between the second passband 622 and the third passband 632 being about 115 MHz. The resulting combined passband 606 is therefore about 365 MHz, which is the combined frequency ranges of the first, second and third passbands 612, 622 and 632 plus the first and second band-gaps 615 and 616. As discussed above, the second band-gap 616 having a larger frequency range than the first band-gap 615 results in the second dip 608 being larger than the first dip 607. That is, the lowest magnitude of signal of the second dip 608 is lower than the lowest magnitude of signal of the first dip 607 (with reference to the highest magnitude of signal in the combined passband 606).

Referring to FIG. 6B, an uplink combined frequency response 675 (indicated by a dotted line) is shown, where the same exemplary LTE frequency bands as discussed above with reference to the downlink combined frequency response 605 are utilized. The combined frequency response 675 is formed by effectively combining a first frequency response corresponding to the first band pass filter 110 (e.g., first frequency response 111 in FIG. 1A), a second frequency response corresponding to the second band pass filter 120 (e.g., second frequency response 121 in FIG. 1A) and a third frequency response corresponding to the third band pass filter 130. The first, second third frequency responses may be substantially the same in shape as the individual frequency responses shown in FIG. 1B, for example (with corresponding passbands, roll-offs and stopbands), but are not specifically depicted in FIG. 6B for the sake of convenience.

The first frequency response corresponds to first passband 642, and the second and third frequency responses correspond to second passband 652. A band-gap 617 exists between the first passband 642 and the second passband 652. That is, the frequency range of the band-gap 617 extends from a highest frequency of the first passband 642 to a lowest frequency of the second passband 652 (in the case where the first passband 642 includes lower frequencies than the second passband 652, as shown in the example of FIG. 6B). A dip 677 is formed in the combined frequency response 675 substantially in the vicinity of the band-gap 617.

More particularly, a portion of an upper first roll-off of the first frequency response overlaps with a portion of a lower second roll-off of the second frequency response at least in part within the band-gap 617, while the non-overlapping portions form the dip 677. Generally, the frequency range of the dip 677 may substantially correspond to the frequency range of the band-gap 617. Notably, a lower roll-off of the combined frequency response 675 substantially coincides with a lower first roll-off of the first frequency response, and an upper roll-off of the combined frequency response 675 substantially coincides with an upper third roll-off of the third frequency response. In the depicted example, the lowest magnitude of signal in the dip 677 may be between about 3 dB and about 6 dB below the highest magnitude of signal in the combined passband 676, for example. Of course, the reduction in signal magnitude within the dip 677 may vary without departing from the scope of the present teachings.

In the depicted example, there is only one dip (dip 677) and two passbands (first and second passbands 642 and 652) even though there are three band pass filters because the second and third passbands corresponding to the second and third band pass filter 120 and 130 are very close to one another (nearly overlapping). Therefore, there is insufficient separation in frequency (negligible band-gap) to accommodate another dip, as a practical matter. Further, combining the second and third passbands into a single pass-band enhances integration and efficiency. Each of the passbands corresponds to a combination of predetermined frequency bands or a single frequency band. In particular, referring to FIGS. 5 and 6B, the first band pass filter 110 has the first passband 642, which corresponds to the uplink of LTE band 3 (1710 MHz to 1785 MHz) and LTE band 4 (1710 MHz to 1755 MHz). The second band pass filter 120 and the third band pass filter 130 collectively have the second passband 652, which combines the uplinks of LTE band 2 (1850 MHz to 1910 MHz), LTE band 25 (1850 MHz to 1915 MHz) and LTE band 1 (1920 MHz to 1980 MHz), such that the total band width of the second passband 652 extends from about 1850 MHz to about 1980 MHz. The various frequency bands are combined into the first and second passbands 642 and 652, respectively, due to the overlapping corresponding frequency ranges.

The present example results in the band-gap 617 between the first passband 642 and the second passband 652 being about 65 MHz. The resulting combined passband 676 is therefore about 270 MHz, which is the combined frequency ranges of the first and second passbands 642 and 652 plus the band-gap 617.

Figure 7:
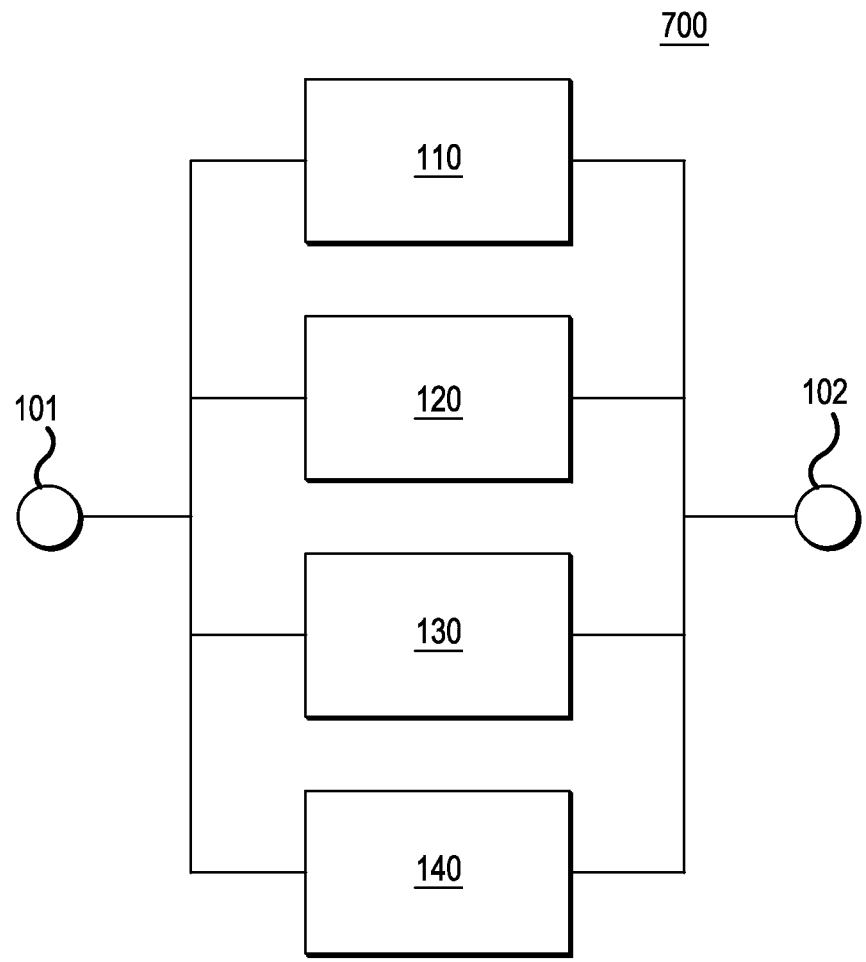
FIG. 7 is a simplified block diagram of an acoustic filter device for telecommunications having a combined passband, according to another representative embodiment.
Figure 8:
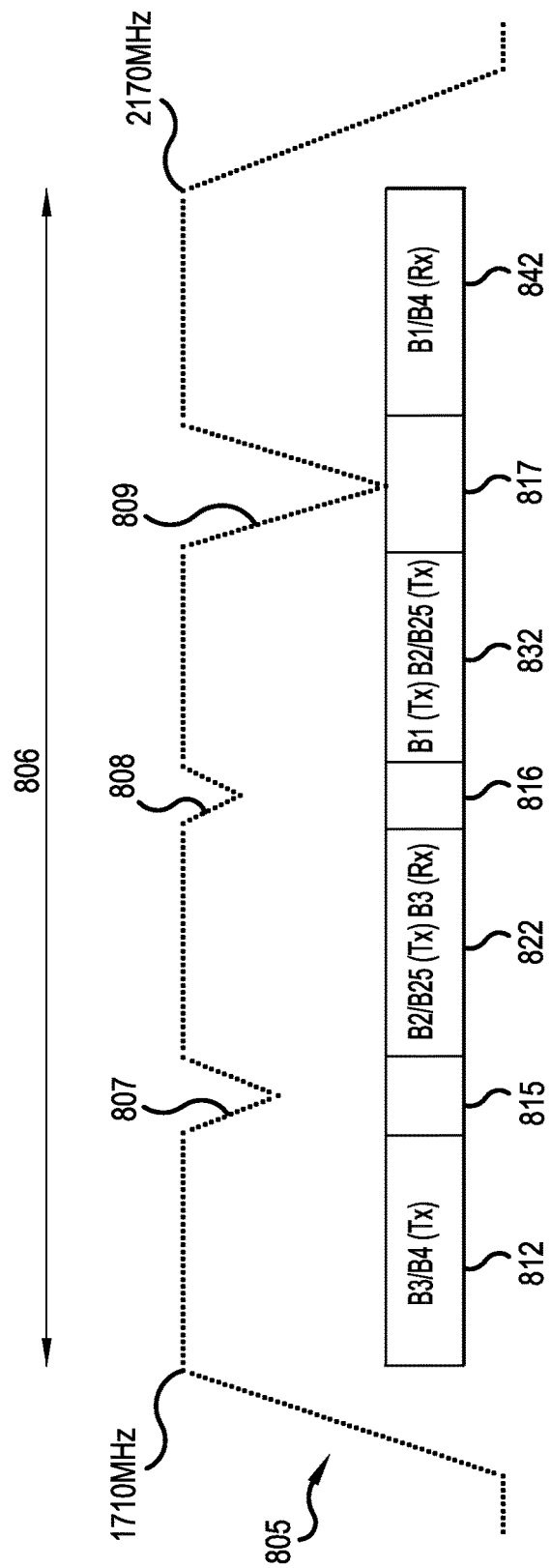
FIG. 8 is a graph showing a simplified frequency response of the acoustic filter device of FIG. 7 including a combined passband with multiple dips, according to a representative embodiment.

FIG. 7 is a simplified block diagram of an acoustic filter device for a telecommunication device having a combined passband, according to another representative embodiment. FIG. 8 is a graph showing a simplified downlink/uplink frequency response of the acoustic filter device of FIG. 7 including a combined passband with multiple dips, according to a representative embodiment.

Referring to FIG. 7, acoustic filter device 700 includes a first band pass filter 110, a second band pass filter 120, a third band pass filter 130, and a fourth band pass filter 140, all connected in parallel with one another between first common port 101 and second common port 102. The first, second, third and fourth band pass filters 110, 120, 130 and 140 have different passbands at corresponding operating frequencies, as discussed below. Accordingly, the first, second, third and fourth band pass filters 110, 120, 130 and 140 block (filter out) frequencies outside the respective passbands. In various embodiments, the first, second, third and fourth band pass filters 110, 120, 130 and 140 are acoustic band pass filters comprising acoustic resonators, such as BAW resonators (e.g., FBARs and/or SMRs) or SAW resonators, for example. Also, each of the first, second, third and fourth band pass filters 110, 120, 130 and 140 may have a ladder-type architecture, for example, including series and shunt connected acoustic resonators, similar to the discussion above with reference to FIG. 4.

Referring to FIG. 8, an uplink/downlink combined frequency response 805 (indicated by a dotted line) is shown. The combined frequency response 805 is formed by effectively combining a first frequency response corresponding to the first band pass filter 110 (e.g., first frequency response 111 in FIG. 1A), a second frequency response corresponding to the second band pass filter 120 (e.g., second frequency response 121 in FIG. 1A), a third frequency response corresponding to the third band pass filter 130, and a fourth frequency response corresponding to the fourth band pass filter 140. The first, second, third and fourth frequency responses may be substantially the same in shape as the individual frequency responses shown in FIG. 1A, for example (with corresponding passbands, roll-offs and stopbands), but are not specifically depicted in FIG. 8 for the sake of convenience.

The first frequency response corresponds to first passband 812, the second frequency response corresponds to second passband 822, the third frequency response corresponds to third passband 832, and the fourth frequency response corresponds to fourth passband 842. A first band-gap 815 exists between the first passband 812 and the second passband 822, a second band-gap 816 exists between the second passband 822 and the third passband 832, and a third band-gap 817 exists between the third passband 832 and the fourth passband 842. That is, the frequency range of the first band-gap 815 extends from a highest frequency of the first passband 812 to a lowest frequency of the second passband 822, the frequency range of the second band-gap 816 extends from a highest frequency of the second passband 822 to a lowest frequency of the third passband 832, and the frequency range of the third band-gap 817 extends from a highest frequency of the third passband 832 to a lowest frequency of the fourth passband 842. A first dip 807 is formed in the combined frequency response 805 substantially in the vicinity of the first band-gap 815, a second dip 808 is formed in the combined frequency response 805 substantially in the vicinity of the second band-gap 816, and a third dip 809 is formed in the combined frequency response 805 substantially in the vicinity of the third band-gap 817.

More particularly, a portion of an upper first roll-off of the first frequency response overlaps with a portion of a lower second roll-off of the second frequency response at least in part within the first band-gap 815, while the non-overlapping portions form the first dip 807. Likewise, a portion of an upper second roll-off of the second frequency response overlaps with a portion of a lower third roll-off of the third frequency response at least in part within the second band-gap 816, while the non-overlapping portions form the second dip 808. Also, a portion of an upper third roll-off of the third frequency response overlaps with a portion of a lower fourth roll-off of the fourth frequency response at least in part within the third band-gap 817, while the non-overlapping portions form the third dip 809. Generally, the frequency ranges of the first, second and third dips 807, 808 and 809 may substantially correspond to the frequency ranges of the first, second and third band-gaps 815, 816 and 817, respectively. A lower roll-off of the combined frequency response 805 substantially coincides with a lower first roll-off of the first frequency response, and an upper roll-off of the combined frequency response 805 substantially coincides with an upper fourth roll-off of the fourth frequency response.

In the depicted example, the first, second and third dips 807, 808 and 809 have different sizes. The lowest magnitude of signal in the second dip 808 is less than the lowest magnitude of signal in the first dip 807, and the lowest magnitude of signal in the second dip 808 is less than the lowest magnitude of signal in the third dip 809. That is, the lowest magnitude of signal in the first dip 807 may be between about 3 dB and about 6 dB, the lowest magnitude of signal in the second dip 808 may be about 3 dB, and the lowest magnitude of signal in the third dip 809 may be between about 3 dB and about 10 dB below the highest magnitude of signal in the combined passband 806, respectively. The sizes of the dips (e.g., the first, second and third dips 807, 808 and 809 result from the sizes of the corresponding band-gaps (e.g., first, second and third band-gaps 815, 816 and 817, respectively, as discussed above. Of course, the reduction in signal magnitude within each of the first, second and third dips 807, 808 and 809 may vary without departing from the scope of the present teachings.

In the depicted embodiment, there are four passbands within the combined passband 806, each corresponding to a combination of predetermined frequency bands or a single frequency band. Unlike the previous embodiments, the combined passband 806 includes passbands for filtering both transmitted (uplink) and received (downlink) signals. For example, the second passband 822 and the third passband 832 are configured to filter transmitted and received RF signals of different frequency bands. More or fewer passbands may be configured to filter transmitted and received RF signals in order to provide unique benefits for particular situations or to meet application specific design requirements of various implementations of the acoustic filter device 700, as would be apparent to one skilled in the art.

In particular, referring to FIGS. 7 and 8, the first band pass filter 110 has the first passband 812, which corresponds to the uplinks of LTE band 3 (1710 MHz to 1785 MHz) and LTE band 4 (1710 MHz to 1755 MHz), such that the total band width of the first passband 812 extends from about 1710 MHz to about 1785 MHz. The second band pass filter 120 has the second passband 822, which combines the uplinks of LTE band 2 (1850 MHz to 1910 MHz) and LTE band 25 (1850 MHz to 1915 MHz), as well as the downlink of LTE band 3 (1805 MHz to 1880 MHz), such that the total band width of the second passband 822 extends from about 1805 MHz to about 1915 MHz. The third band pass filter 130 has the third passband 832, which combines the uplink of LTE band 1 (1920 MHz to 1980 MHz), as well as the downlinks of LTE band 2 (1930 MHz to 1990 MHz) and LTE band 25 (1930 MHz to 1995 MHz), such that the total band width of the third passband 832 extends from about 1920 MHz to about 1995 MHz. The fourth band pass filter 140 has the fourth passband 842, which corresponds to the downlinks of LTE band 1 (2110 MHz to 2170 MHz) and LTE band 4 (2110 MHz to 2155 MHz), such that the total band width of the fourth passband 842 extends from about 2110 MHz to about 2170 MHz.

The present example results in the first band-gap 815 between the first passband 812 and the second passband 822 being about 20 MHz, the second band-gap 816 between the second passband 822 and the third passband 832 being about 5 MHz, and the third band-gap 817 between the third passband 832 and the fourth passband 842 being about 115 MHz. The resulting combined passband 806 is therefore about 460 MHz, which is the combined frequency ranges of the first, second, third and fourth passbands 812, 822, 832 and 842 plus the first, second and third band-gaps 815, 816 and 817. As discussed above, the third band-gap 817 having a larger frequency range than the first band-gap 815 results in the third dip 809 being larger than the first dip 807. Also, the first band-gap 815 having a larger frequency range than the second band-gap 816 results in the first dip 807 being larger than the second dip 808. That is, the lowest magnitude of signal of the third dip 809 is lower than the lowest magnitude of signal of the first dip 807, which is lower than the lowest magnitude of the second dip 808 (with reference to the highest magnitude of signal in the combined passband 806).

FIGS. 9A to 9D are a series of graphs showing simulated frequency response of an acoustic filter device including a combined passband, according to a representative embodiment.

The graphs in FIGS. 9A, 9B and 9C depict S-parameter S21 (insertion loss) as a function of frequency over different scales, respectively, for a simulated acoustic filter device having two parallel connected band pass filters (e.g., such as acoustic filter device 100 shown in FIG. 1A). As shown in each of graphs in FIGS. 9A, 9B and 9C, insertion loss trace 901 includes a dip 906 in the combined passband region 907. Notably, the combined passband region 907 shows very steep roll-offs on both the lower and upper frequency cut-offs of the combined passband. The graph in FIG. 9D depicts S-parameter S11 (reflection coefficient) as a function of frequency. As shown in the graph in FIG. 9D, reflection coefficient trace 911 depicts return loss.

The various components, structures and parameters are included by way of illustration and example only and not in any limiting sense. For example, the number of acoustic band pass filters connected in parallel in the acoustic filter device may vary, the number of passbands within each of the acoustic band pass filters may vary, and/or the number and type of frequency ranges or predetermined LTE frequency bands may vary within each of the passbands, without departing from the scope of the present teachings. In view of this disclosure, those skilled in the art can implement the present teachings in determining their own applications and needed components, materials, structures and equipment to implement these applications, while remaining within the scope of the appended claims.

The invention claimed is:

1. An acoustic filter device for telecommunication devices, comprising:
   a first acoustic band pass filter having a corresponding first passband; and
   a second acoustic band pass filter having a corresponding second passband, the second acoustic band pass filter being connected in parallel with the first acoustic band pass filter to provide a combined passband comprising the first and second passbands, wherein the first acoustic band pass filter has a corresponding first roll-off, and the second acoustic band pass filter has a corresponding second roll-off, and a portion of the first roll-off overlaps a portion of the second roll-off adjacent the first roll-off at least in part within a band-gap between the first and second passbands, wherein the combined passband comprises a dip formed by non-overlapping portions of the first roll-off and the adjacent second roll-off, a lowest magnitude of signal in the dip being between about 3 dB and about 6 dB below a highest magnitude of signal in the combined passband.

2. The acoustic filter device of claim 1, wherein a frequency range of the band-gap extends from a highest frequency of the first passband to a lowest frequency of the second passband.

3. The acoustic filter device of claim 1, wherein each of the first and second acoustic band pass filters has ladder-type architecture.

4. The acoustic filter device of claim 1, wherein each of the first and second acoustic band pass filters comprises a plurality of bulk acoustic wave (BAW) resonators.

5. The acoustic filter device of claim 4, wherein each of the BAW resonators comprise one of a solidly mounted resonator (SMR) or a thin film bulk acoustic resonator (FBAR).

6. The acoustic filter device of claim 1, wherein the first and second passbands correspond to predetermined frequency bands standard for telecommunication devices, respectively.

7. The acoustic filter device of claim 6, wherein the predetermined frequency bands comprise at least one of a Long Term Evolution LTE standard, Global Navigation Satellite System (GNSS) standard, and a WiFi standard.

8. The acoustic filter device of claim 1, wherein the first and second acoustic band pass filters have different bandwidths, respectively.

9. The acoustic filter device of claim 1, further comprising:
a third acoustic band pass filter having a corresponding third passband, the third acoustic band pass filter being connected in parallel with the first and second acoustic band pass filters to provide the combined passband comprising the first, second and third passbands.

10. An acoustic filter device, comprising:
a first acoustic band pass filter having a corresponding first passband; and
a second acoustic band pass filter having a corresponding second passband, the second acoustic band pass filter being connected in parallel with the first acoustic band pass filter to provide a combined passband including the first and second passbands,
wherein a band-gap is positioned between the first passband and the second passband, the band-gap comprising a dip formed by non-overlapping portions of a first roll-off of the first acoustic band pass filter and a second roll-off of the second acoustic band pass filter,
wherein the dip formed by the non-overlapping portions of the first roll-off of the first acoustic band pass filter and the second roll-off of the second acoustic band pass filter has a lowest magnitude of signal between about 3 dB and about 6 dB below a highest magnitude of signal in the combined passband.

11. The acoustic filter device of claim 10, wherein each of the first and second acoustic band pass filters has ladder-type architecture.

12. The acoustic filter device of claim 11, wherein each of the first and second acoustic band pass filters comprises a receive filter configured to filter a radio frequency (RF) signal received from an antenna.

13. The acoustic filter device of claim 10, wherein each of the first and second acoustic band pass filters comprises a transmit filter configured to filter a radio frequency (RF) signal sent by a transmitter.

14. An acoustic filter device, comprising:
a plurality of acoustic band pass filters connected in parallel to provide a combined passband, each of the acoustic band pass filters having a ladder-type architecture,
wherein the combined passband comprises a plurality of passbands corresponding to the plurality of acoustic band pass filters, respectively, and a plurality of dips in magnitude of signal in the combined passband substantially corresponding to band-gaps between adjacent passbands of the plurality of passbands within the combined passband, and
wherein the adjacent passbands have corresponding roll-offs, portions of which overlap, resulting in non-overlapping portions of the corresponding roll-offs forming the plurality of dips, respectively.

\* \* \* \* \*